United States Patent
Simon et al.

(10) Patent No.: US 9,209,830 B2
(45) Date of Patent: Dec. 8, 2015

(54) DECODING A MANCHESTER CODE WITHOUT A PLL FOR SHORT DATA SEQUENCES

(71) Applicant: SEW-EURODRIVE GMBH & CO. KG, Bruchsal (DE)

(72) Inventors: Olaf Simon, Bruchsal (DE); Steffen Quadt, Karlsruhe (DE); Michael Müller, Karlsruhe (DE); Julian Hoffmann, Sippersfeld (DE)

(73) Assignee: SEW-EURODRIVE GMBH & CO. KG, Bruchsal (DE)

( * ) Notice: Subject to any disclaimer, the term of this patent is extended or adjusted under 35 U.S.C. 154(b) by 0 days.

(21) Appl. No.: 14/404,802

(22) PCT Filed: May 6, 2013

(86) PCT No.: PCT/EP2013/001327
§ 371 (c)(1),
(2) Date: Dec. 1, 2014

(87) PCT Pub. No.: WO2013/178318
PCT Pub. Date: Dec. 5, 2013

(65) Prior Publication Data
US 2015/0123824 A1  May 7, 2015

(30) Foreign Application Priority Data
May 29, 2012  (DE) .......................... 10 2012 010 375

(51) Int. Cl.
*H03M 7/12* (2006.01)
*H03M 5/12* (2006.01)

(52) U.S. Cl.
CPC ...................................... *H03M 5/12* (2013.01)

(58) Field of Classification Search
CPC ......... H03M 5/12; H04L 25/02; H04L 25/49; H04L 25/4904; H04L 25/4908; H04L 7/033; H04L 7/046; H04L 7/0337
USPC ............ 341/70; 375/340, 350, 230, 232, 235, 375/333
See application file for complete search history.

(56) References Cited

U.S. PATENT DOCUMENTS

| | | | | |
|---|---|---|---|---|
| 4,100,541 A | * | 7/1978 | Quesnell, Jr. | .................... 341/70 |
| 4,881,059 A | | 11/1989 | Saltzberg | |
| 5,163,067 A | * | 11/1992 | Wight et al. | .................... 341/70 |
| 5,224,126 A | * | 6/1993 | Myers et al. | .................... 341/70 |
| 5,696,800 A | | 12/1997 | Berger | |

(Continued)

FOREIGN PATENT DOCUMENTS

EP    1 528 738    5/2005

OTHER PUBLICATIONS

International Search Report, dated Oct. 14, 2013, issued in corresponding International Application No. PCT/EP2013/001327.

(Continued)

*Primary Examiner* — Lam T Mai
(74) *Attorney, Agent, or Firm* — Kenyon & Kenyon LLP

(57) ABSTRACT

In a decoding device for a Manchester-encoded signal, at least one moving data average and/or one moving clock average is/are formed relative to mutually differing average times using moving-type averaging units, and from these moving average values, binary output signals are made available as data signal and/or clock signal with the aid of comparators.

23 Claims, 7 Drawing Sheets

(56) References Cited

U.S. PATENT DOCUMENTS

| | | | |
|---|---|---|---|
| 6,008,746 A * | 12/1999 | White | 341/70 |
| 6,064,705 A * | 5/2000 | Zalud et al. | 341/70 |
| 6,370,212 B1 * | 4/2002 | Nakai | 341/70 |
| 7,133,482 B2 | 11/2006 | Poletto et al. | |
| 2010/0208849 A1 | 8/2010 | Grosskinsky | |
| 2013/0027228 A1 * | 1/2013 | Govindammagari et al. | 341/70 |

OTHER PUBLICATIONS

Written Opinion, dated Oct. 14, 2013, issued in corresponding International Application No. PCT/EP2013/001327.

International Preliminary Report on Patentability, dated Jan. 7, 2015, issued in corresponding International Application No. PCT/EP2013/001327.

* cited by examiner

DECODING A MANCHESTER CODE WITHOUT A PLL FOR SHORT DATA SEQUENCES

FIELD OF THE INVENTION

The present invention relates to a decoding method and a decoding device.

BACKGROUND INFORMATION

Manchester coding is used to transmit signals from a transmitter to a receiver. As a rule, the transmission data stream is in the form of a data signal and a clock signal. In order to avoid the transmission of two signals from the transmitter to the receiver, a Manchester-encoded signal is generated from the clock signal and the data signal. It is therefore possible to transmit the data stream over one shared signal line to the receiver. However, since the receiver likewise needs a clock signal and a data signal again for further processing, the Manchester-encoded signal must be decoded again. This decoding requires the recovery of the clock signal from the signal transmitted.

In the decoding methods known from the related art, in the simplest case, the receiver synchronizes itself to the first start bit received, and in each instance evaluates all following bits at half the a priori known bit time. To also permit the correct readout of the last bit, the time base of the receiver after the last transmitted bit is allowed to be deviated by the half-bit time at most. Thus, the Manchester-encoded signal must be sampled with a frequency which, for typical application cases, is allowed to deviate only by 0.2% from the transmit frequency. This requirement can only be satisfied with great expenditure, and in any event, in a manner relatively susceptible to faults.

Therefore, known decoding methods rely on phase-locked loops (PLL) which, on the basis of the signal edges occurring in the input signal, continuously track the sampling frequency of the receiver in such a way that it is kept as synchronous as possible with the transmit frequency. In this way, the clock signal of the transmitter is reconstructed. However, disadvantages of methods which generate a synchronize clock signal for the sampling of the input signal are that interferences in the input signal may fall at the sampling instant and therefore cause errors in the decoding. An example for the one-time sampling of the input signal within a half-bit time is found in U.S. Pat. No. 4,881,059 A.

A further disadvantage of the PLL is that it is a feedback structure or structure controlled in closed-loop which must pass through a transient time up to the desired function, and whose interpretation of the control parameters must be optimized with respect to possible instabilities. Especially in the case of short messages, which in each case are transmitted with a time interruption, the result is that a new transient phase is produced in each instance. Thus, there is the possibility that the beginning of each message cannot be decoded correctly.

The U.S. Pat. No. 7,133,482 B2 describes a method which is intended to avoid the disadvantages described. In that case, a two-step signal evaluation is carried out. In a first step, the received signal is filtered, so that interferences cannot negatively influence the downstream evaluation process. The evaluation is carried out downstream by evaluating the filtered input signal at fixed points in time after the last recognized edge, thereby permitting a continuous adjustment to the clock pulse of the transmitter without a PLL. A range-limited integrator is used as input filter.

In U.S. Pat. No. 5,696,800, a method is described in which fault tolerance is achieved by the generation of two clock signals that are produced by filters of different bandwidths. However, costly structures are thereby obtained.

In U.S. Pat. No. 6,370,212 B1, the use of a moving-type averaging filter is introduced for evaluating the Manchester-encoded signal. This implementation generates the decoded clock signal, but still from a phase-locked loop downstream of the moving-type averaging filter. Because of this, an incoming signal may first be evaluated as of the instant from which the phase-locked loop is also synchronized. Therefore, the complete decoding of short signal sequences is not possible. In addition, transition points are generated as input signal for the phase-locked loop. Since this signal is derived from the first slope change, in the case of disturbed input signals, marked time deviations may result which hamper the decision as to whether the phase-locked loop is locked in and consequently the decoded signals are valid. Therefore, only limited interference insusceptibility is achieved.

SUMMARY

An object of the present invention is to further develop a decoding method which allows the processing of short messages of Manchester-encoded signals.

Important features of the invention with regard to a decoding method for a Manchester-encoded signal are that a moving data average with a data average time is formed for the Manchester-encoded signal and that a decoded data signal is formed from the moving data average by a data comparator and made available. This is advantageous because only components which have comparatively short transient times are necessary. Therefore, short data messages in Manchester coding are able to be processed.

In one advantageous development of the invention of possibly independent significance, a moving clock average with a clock average time may be formed for the Manchester-encoded signal, and a clock signal may be formed at least from the moving clock average by a clock comparator and made available. Further signals may be processed for forming the decoded clock signal. The advantage in this context is that a phase-locked loop is not necessary. It is also not necessary to know the bit time of the clock signal; rather, it may be derived from the reconstructed clock signal.

In one advantageous refinement of the invention of possible independent significance, a moving EOT average with an EOT average time may be formed for the Manchester-encoded signal, the EOT average time may be longer than the data average time and/or clock average time, and an EOT signal may be formed from the moving EOT average by an EOT comparator and made available. In this connection, the abbreviation EOT denotes the end of transmission. The advantage in this case is that the end of transmission is recognizable automatically. For example, this may be used for resetting the different comparators, especially the threshold values, and/or averaging units.

In one advantageous embodiment, in order to form the clock signal, an output signal of the clock comparator may be logically combined with an output signal of the data comparator. Preferably, the output signal of the clock comparator is combined with the output signal of the data comparator, particularly the data signal. It is especially favorable if the output signals indicated are logically combined by exclusive OR operation. This offers the advantage of indicating a simple method by which the clock signal is able to be reconstructed. It is possible to dispense with phase-locked loops, so that short transient and response times are achievable. This development is usable with advantage in the case of an embodiment in which a data signal and a clock signal are formed in the manner described. In one advantageous development, the clock average time may be shorter than the data average time. Therefore the clock signal of slightly higher frequency compared to the data signal is able to be separated easily.

In one advantageous refinement, in order to form the moving data average, the moving clock average and/or the moving EOT average, a signal derived from the Manchester-encoded signal may be integrated over the data average time, clock average time or EOT average time. Thus, individual or all the averages indicated may be attained by integration. Integration represents a simple means of calculating the averages.

In one advantageous embodiment, in order to form the moving data average, clock average and/or EOT average, a differential signal may be formed progressively from differences between each symbol of the Manchester-encoded signal and a symbol—time-shifted relative to this symbol by a predefined time duration—of the Manchester-encoded signal sequence as the signal derived from the Manchester-encoded signal. This offers the advantage that a derived signal, from which a moving average may be formed by integration or in some other way, is able to be made available in an easy manner and is made available.

In one advantageous refinement, the data comparator may compare the moving data average to at least one data threshold value, and output the decoded data signal as a function of an exceedance of or drop below the at least one data threshold value. This is advantageous because a binary signal is able to be obtained in an easy manner by the data comparator from the fine-step or analog moving data average.

In one advantageous development, the at least one data threshold value may include a lower data threshold value and an upper data threshold value, and the data comparator may output the decoded signal as a function of an exceedance of the upper data threshold value and/or a drop below the lower data threshold value. This is advantageous because a hysteresis behavior of the data comparator is able to be reproduced in this manner. This is especially favorable for the generation of the binary signal, since too frequent a switchover may be avoided in the transition region of the threshold values.

In one advantageous development, the lower data threshold value may be equal to or greater than the upper clock threshold value. In this case, an especially advantageous separation of the data signal from the clock signal is obtained.

In one advantageous refinement, an arithmetic mean of the lower data threshold value and the upper data threshold value may lie between zero and one, especially between 0.3 and 0.7 or at ½. It has become apparent that the symmetrical placement of the arithmetic mean and/or of the lower and the upper threshold value in relation to the limits 0 and 1 is especially favorable for the extraction of the data signal.

In one advantageous embodiment, a time duration which is greater than a half-bit time of a clock signal of the Manchester-encoded signal may be established as data average time. It may also be provided that a time duration which is less than 1.5 times the bit time of a clock signal of the Manchester-encoded signal is established as data average time. If these range limits are combined, it ensues as advantageous refinement that a time duration which lies between a half-bit time and 1.5 times the bit time of the clock signal of the Manchester-encoded signal is selected as data average time. It has become apparent that particularly robust decodings of the data signal are attainable for these values. It is especially beneficial if a time duration which lies between 0.8 times and 1.2 times the bit time of the clock signal, particularly which is equal to the bit time of the clock signal, is established as data average time.

In one advantageous embodiment, a time duration which is less than a bit time of a clock signal of the Manchester-encoded signal may be established as clock average time. This offers the advantage that in this way, a filter is able to be formed for frequencies, comparatively higher relative to the data signal, which include the clock signal. It is especially beneficial if a time duration which lies between 0.3 times and 0.7 times the bit time of the clock signal, particularly which is equal to the half-bit time of a clock signal of the Manchester-encoded signal, is established as clock average time.

In one advantageous embodiment, a time duration which is greater than a bit time of a clock signal of the Manchester-encoded signal may be established as EOT average time. This offers the advantage that in this way, a filter is able to be formed for frequencies comparatively lower relative to the data signal, with which the end of transmission is easily recognizable. It is especially beneficial if a time duration which lies between 1.3 times and 1.7 times the bit time of the clock signal, particularly which is equal to 1.5 times the bit time of a clock signal of the Manchester-encoded signal, is established as EOT average time.

In one advantageous refinement, the clock comparator may compare the moving clock average to at least one clock threshold value, and output an output signal as a function of an exceedance of or drop below the at least one clock threshold value. The advantage in this case is that a binary signal is able to be formed from the fine-step or analog, moving clock average and made available.

In one advantageous development, the at least one clock threshold value may include a lower clock threshold value and an upper clock threshold value, and the clock comparator may output an output signal as a function of an exceedance of the upper clock threshold value and/or a drop below the lower clock threshold value. This is advantageous because a hysteresis behavior is able to be realized at the clock comparator. An especially interference-immune generation of a clock single is thereby attainable.

In one advantageous embodiment, it may be beneficial that an arithmetic mean of the lower clock threshold value and the upper clock threshold value lies or is selected between zero and one. It is particularly favorable if the arithmetic mean of the lower clock threshold value and the upper clock threshold value lies below the arithmetic mean of the lower data threshold value and the upper data threshold value. It is especially preferred if the arithmetic mean of the lower clock threshold value and the upper clock threshold value lies between 0.2 and 0.3 or at ¼. It has turned out that particularly robust decoding methods are able to be formed for the numerical values indicated.

The signal strengths indicated here and in the entire specification, especially for threshold values and averages, are preferably specific in each case to the edge height of the Manchester-encoded signal.

In one advantageous development, the moving data average, clock average and/or EOT average may be formed simultaneously and/or concurrently relative to each other. This is advantageous because a particularly rapid decoding method is able to be provided, with which the incoming data may be decoded in real time.

In one advantageous refinement, the moving data average, clock average and/or EOT average may be formed with a sampling rate that in each case is smaller than the or a bit time of the or a clock signal of the Manchester-encoded signal. The advantage in this instance is that it permits a fine-step formation of the respective average. Preferably, the sampling rate is less than $1/10$ or even than $1/100$ the bit time of the clock signal. The sampling rate is preferably $1/256$ of the bit time.

In one advantageous embodiment, the moving data average, clock average and/or EOT average may be formed isochronously with a provision of further symbols of the Manchester-encoded signal. This offers the advantage that the decoded information is already able to be made available and further processed when the message is not yet completely received.

The method steps described for forming the data signal, the clock signal and the EOT signal are combined with each other in further exemplary embodiments. For example, in one advantageous development, a data signal and a clock signal are formed in the manner described. In further exemplary embodiments, a data signal and an EOT signal are formed in the manner described. In another development, a clock signal and an EOT signal are formed in the manner described. Finally, in a further embodiment, a data signal, a clock signal and an EOT signal are formed.

Important features of the present invention with regard to a decoding device having a signal input for a Manchester-encodable signal and a data-signal output for a data signal decoded from the Manchester-encoded signal are that a data-signal flow path is set up from the signal input to a moving-type data-averaging unit, from there to a data comparator and from there to the data-signal output. In this context, a signal flow path denotes the path the signals take through the decoding device during processing, e.g., according to the decoding method of the present invention. This is advantageous because a decoding device is made available with which a decoding method according to the present invention is executable, using which, a decoded data signal is provided. In this connection, the moving-type data-averaging unit may be set up to form a moving data average. In general, a comparator is understood to be a comparator circuit which compares an input signal to a predefined signal, e.g., a threshold value, or to a further input signal, e.g., a variable threshold value, and outputs the result of this comparison as output signal.

Alternatively or additionally, in one embodiment of possibly independent significance, the decoding device may be equipped with a signal input for a Manchester-encodable signal and a data-signal output for a data signal decoded from the Manchester-encoded signal, and a clock-signal flow path may be set up from the signal input to a moving-type clock-averaging unit, from there to a clock comparator, and from there to a clock-signal output. This is advantageous because it is possible to dispense with phase-locked loops in forming the clock signal. Short transient times are thus attainable.

In one advantageous embodiment of possibly independent significance, the decoding device may be equipped with a signal input for a Manchester-encodable signal and a data-signal output for a data signal decoded from the Manchester-encoded signal, and an EOT-signal flow path may be set up from the signal input to a moving-type EOT-averaging unit, from there to an EOT comparator, and from there to the EOT-signal output. The advantage in this case is that the end of transmission (EOT) is recognizable using simple means, even for short messages and signal sequences. It is especially beneficial if the EOT comparator is in control connection with the moving-type clock-averaging unit and/or the moving-type data-averaging unit in order to reset the moving-type clock-averaging unit and/or the moving-type data-averaging unit at the detected end of transmission.

In one development of the present invention, a lower boundary of an integrator in the moving-type data-averaging unit may be limited, in particular, may be limited to 0.5, so long as no input signal is recognized, especially by the EOT comparator. This is advantageous because it is possible to dispense with a leading logical zero in the Manchester-encoded signal for marking the beginning of transmission.

It is particularly favorable if the decoding device of the present invention has at least two or three signal flow paths from the group made up of data-signal flow path, clock-signal flow path and EOT-signal flow path. For many purposes, it is already sufficient if a data-signal flow path and a clock-signal flow path are formed in the manner described in the decoding device according to the invention.

In one advantageous refinement, it may be provided that a moving average of the Manchester-encoded signal is able to be formed over a data average time by the moving-type data-averaging unit. The advantage in this context is that an averaging unit represents a practicable tool with which a moving average may be formed quickly and in real time.

In one advantageous refinement, it may be provided that a moving average of a signal derived from the Manchester-encoded signal is able to be formed over a clock average time by the moving-type clock-averaging unit. The advantage in this instance is that the moving clock average needed in the method may be easily formed.

In one advantageous development, it may be provided that a moving average of the Manchester-encoded signal is able to be formed over an EOT average time by the moving-type EOT-averaging unit. An averaging unit may be used advantageously for calculating the moving average in this case, as well.

The average times used in this connection are preferably selected as described before with regard to the decoding method.

In one advantageous development, a logic-operations device may be set up for the logical interconnection of an output signal of the data comparator with an output signal of the clock comparator. In this context, it may be provided to route the clock-signal flow path from a signal output of the logic-operations device to the clock-signal output. The advantage in so doing is that a simple method is able to be realized for reconstructing or decoding the clock signal without a phase-locked loop. Preferably, the logic-operations device realizes an exclusive OR operation.

In one advantageous development, the averaging unit may be set up to form or calculate a differential signal, the differential signal expressing symbol-wise the difference of symbols of the Manchester-encoded signal with respect to a symbol time-shifted by a predefined time duration relative to the respective symbol. The advantage in this case is that a signal derived from the Manchester-encoded signal is made available, which is able to be further processed for the averaging by integration or in some other way.

In one advantageous refinement, it may be beneficial that the data comparator is equipped for the output of an output signal as a function of an exceedance of or drop below at least one data threshold value, particularly for the output of an output signal as a function of an exceedance of an upper data threshold value of the at least one data threshold value and/or a drop below a lower data threshold value of the at least one data threshold value. The advantage in this instance is that a simple means is formed for generating a binary data signal. Due to the formation of an upper data threshold value and a separate lower data threshold value, a hysteresis is able to be realized upon the conversion into a binary signal, which suppresses too frequent a switchover because of disturbances.

In one advantageous refinement, the clock comparator may be equipped for the output of an output signal as a function of an exceedance of or drop below at least one clock threshold value, particularly for the output of an output signal as a function of an exceedance of an upper clock threshold value of the at least one clock threshold value and/or a drop below a lower clock threshold value of the at least one clock threshold value. The advantage in this case is that a binary output signal able to be further processed is made available.

In one advantageous development, the EOT comparator may be equipped for the output of an output signal as a function of an exceedance of or drop below at least one EOT threshold value, particularly for the output of an output signal as a function of an exceedance of the upper EOT threshold value of the at least one EOT threshold value and/or a drop below a lower EOT threshold value of the at least one EOT threshold value. The advantage in so doing is that the end of transmission is easily recognizable in binary fashion.

In one advantageous development, the comparators may in each case take the form of a Schmitt trigger.

In one advantageous refinement, the decoding device may be set up for the simultaneous and/or concurrent formation of the moving data, clock and/or EOT averages. The advantage is that parallel processing is realizable in time-saving manner.

In one advantageous refinement, the moving data average, clock average and or EOT average may be formed with a sampling rate that in each case is less than the or a bit time, especially less than 1/10 or 1/100, of the or a clock signal of the Manchester-encoded signal. The advantage in this case is that a fine-step sampling of the received Manchester-encoded signal is possible.

In one advantageous refinement, the decoding device may be set up to form the moving data average, clock average and/or EOT average isochronously with the provision of further symbols of the Manchester-encoded signal. The advantage is that the decoded data signal is thereby able to be made available before the Manchester-encoded message is fully received.

In one refinement of the invention, a control connection may be formed between the EOT comparator and the data comparator and/or the data-averaging unit. This offers the advantage that after an end of transmission has been recognized, the data comparator and/or the data-averaging unit may be returned to a starting state. Thus, start sequences may be omitted in the data signal.

The present invention will now be explained in greater detail with reference to the drawing.

DETAILED DESCRIPTION

Figure 1:
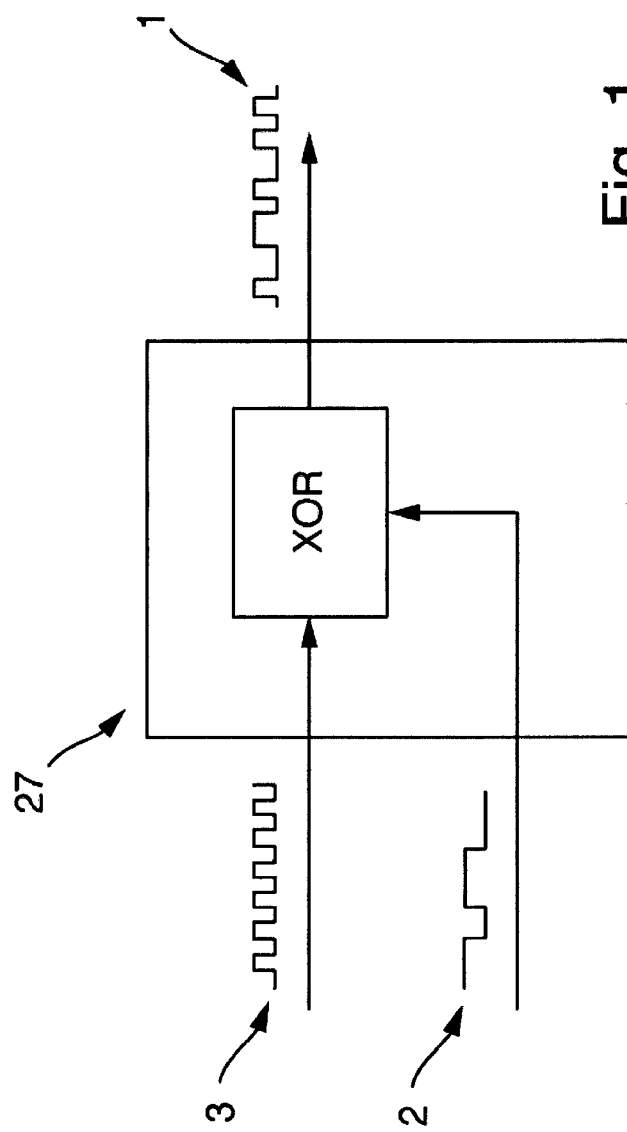
FIG. 1 shows the generation of a Manchester-encoded signal in highly simplified manner as a schematic diagram.

To explain the general technological background, FIG. 1 shows the generation of a Manchester-encoded signal 1 by an encoding device 27. This Manchester-encoded signal is obtained by exclusive OR operation from an original data signal 2 and an original clock signal 3 in a manner known per se.

Figure 2:
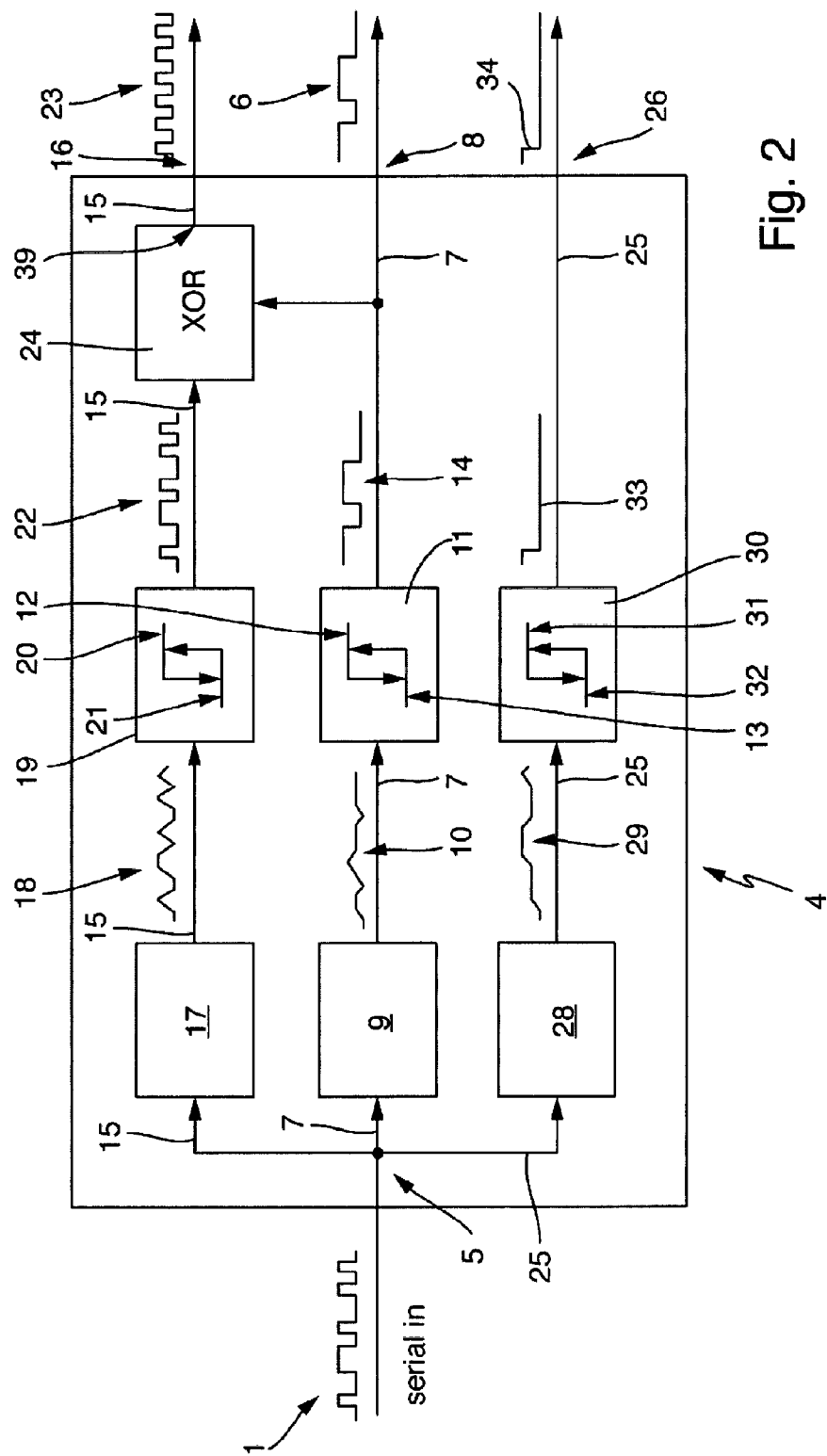
FIG. 2 shows a highly simplified block diagram of a decoding device according to the present invention for clarifying the decoding method of the invention.

Manchester-encoded signal 1 is delivered to a receiver and conveyed from there to a decoding device shown in FIG. 2 and denoted as a whole by reference numeral 4. Manchester-encoded signal 1 is thus applied at a signal input 5 of decoding device 4.

Decoding device 4 generates a decoded data signal 6 from Manchester-encoded signal 1, as explained in greater detail below.

To process Manchester-encoded signal 1, a data-signal flow path 7 is formed which connects signal input 5 to a data-signal output 8.

In the signal-flow direction at the beginning of data-signal flow path 7, a moving-type data-averaging unit 9 is disposed, with which a moving data average 10 is calculated from Manchester-encoded signal 1. In so doing, moving data average 10 is formed relative to a data average time which is equal to the bit time, thus, the period of original clock signal 3.

Downstream of moving-type data-averaging unit 9 in the signal-flow direction in data-signal flow path 7, a data comparator 11 is disposed to which moving data average 10 is supplied.

A lower data threshold value 12 and an upper data threshold value 13 are stored in data comparator 11.

Data comparator 11 generates an output signal 14 which is dependent on whether moving data average 10 exceeds upper data threshold value 13 or falls below lower data threshold value 12. If moving data average 10 falls below lower data threshold value 12, a logical zero is output. If moving data average 10 exceeds upper data threshold value 13, a logical one is output.

Output signal 14 of data comparator 11 is output as decoded data signal 6 at data-signal output 8.

Also formed in decoding device 4 is a clock-signal flow path 15 which connects signal input 5 to a clock-signal output 16.

In the signal-flow direction at the beginning of clock-signal flow path 15, a moving-type clock-averaging unit 17 is disposed, with which a moving clock average 18 is formed from Manchester-encoded signal 1.

The functioning method of moving-type clock-averaging unit 17 is analogous to the functioning method of moving-type data-averaging unit 9, with the difference that a clock average time, which is equal to a half-bit time of original clock signal 3, is set in the moving-type clock-averaging unit.

Moving clock average 18 is supplied to a clock comparator 19.

Clock comparator 19 functions analogously to data comparator 11, with the difference that a deviating lower clock threshold value 20 and a different upper clock threshold value 21 are set.

In general, it may be said with regard to this exemplary embodiment that lower data threshold value 12 is given by the expression 0.25+D, while upper data threshold value 13 is given by the value 0.75−D. In this context, D is a number between −0.25 and +0.25. It is obvious that the arithmetic mean of lower data threshold value 12 and upper data threshold value 13 lies at 0.5, regardless of the selection of D.

On the other hand, in this exemplary embodiment, the value 0.25−H is set as lower clock threshold value 20, while upper clock threshold value 21 is defined at 0.25+H. In this context, H is a number between 0 (inclusive) and +0.25 (exclusive). It is obvious that the arithmetic mean of lower clock threshold value 20 and upper clock threshold value 21 is less than the arithmetic mean of the data threshold values indicated before. To be more precise, this arithmetic mean of the clock threshold values lies at 0.25 in the exemplary embodiment.

In the case of further exemplary embodiments of the present invention, the upper and lower threshold values do not necessarily have to be shifted symmetrically relative to an average value.

An advantageous choice results for H=$\frac{1}{12}$ and/or D=$\frac{1}{12}$. The selection H=D=$\frac{1}{12}$ is especially preferred. In this way, a relatively good compromise is achieved between the filtering of spikes and a frequency tolerance. This selection is put into effect in the present exemplary embodiment and in the exemplary embodiment further described in the following.

In the case of further exemplary embodiments, other values are realized for H and D. For example, H=$\frac{1}{12}$ is possible, while D is set to a different value. It may also be that D=$\frac{1}{12}$, while H is set to a different value. Finally, both H and D may be set to values other than $\frac{1}{12}$. For example, in general, H=D≠$\frac{1}{12}$ may be set. Values in the range between 0.06 and 0.1, especially in the range between 0.07 and 0.09, may also be used advantageously for H and/or D.

From output signal 22 of clock comparator 19, a clock signal 23 is formed and made available at clock-signal output 16.

To that end, output signal 22 of clock comparator 19 is supplied to a logic-operations device 24.

In logic-operations device 24, a logical exclusive OR interconnection of output signal 22 of clock comparator 19 with output signal 14 of data comparator 11, thus reconstructed data signal 6, is realized.

Logic-operations device 24 is thus located in the signal flow direction downstream of clock comparator 19 in clock-signal flow path 15.

Decoding device 4 also has an EOT-signal flow path 25 which runs between signal input 5 and an EOT-signal output 26.

In the signal flow direction at the beginning of EOT-signal flow path 25, a moving-type EOT-averaging unit 28 is disposed which functions analogously to moving-type data-averaging unit 9 and moving-type clock-averaging unit 17. In the case of moving-type EOT-averaging unit 28, however, the average value is generated relative to an EOT average time which is selected to be greater than the data average time in moving-type data-averaging unit 9 and the clock average time in moving-type clock-averaging unit 17. In the exemplary embodiment, the EOT average time is selected at 1.5 times the bit time of clock signal 3.

Thus, from Manchester-encoded signal 1, moving-type EOT-averaging unit 28 generates a moving EOT average 29 which is fed in EOT-signal flow path 25 to an EOT comparator 30.

EOT comparator 30 functions in a manner analogous to data comparator 11 and clock comparator 19. At EOT comparator 30, a lower EOT threshold value 31 and an upper EOT threshold value 32 are predefined, which may deviate from the threshold values of data comparator 11 and clock comparator 19. Lower EOT threshold value 31 and upper EOT threshold value 32 are selected in such a way that a desired hysteresis behavior of EOT comparator 30 is achieved upon generation of binary output signal 33.

It is especially beneficial if upper EOT threshold value 32 is selected to be equal to lower EOT threshold value 31. For example, both EOT threshold values 31, 32 may be set in the range between 0 and 0.5, preferably equal to 0.25.

This output signal 33 of EOT comparator 30 is output as EOT signal 34 at EOT-signal output 26.

Optionally, an inverter (not further shown) is disposed in EOT-signal flow path 25 downstream of EOT comparator 30.

Figure 3:
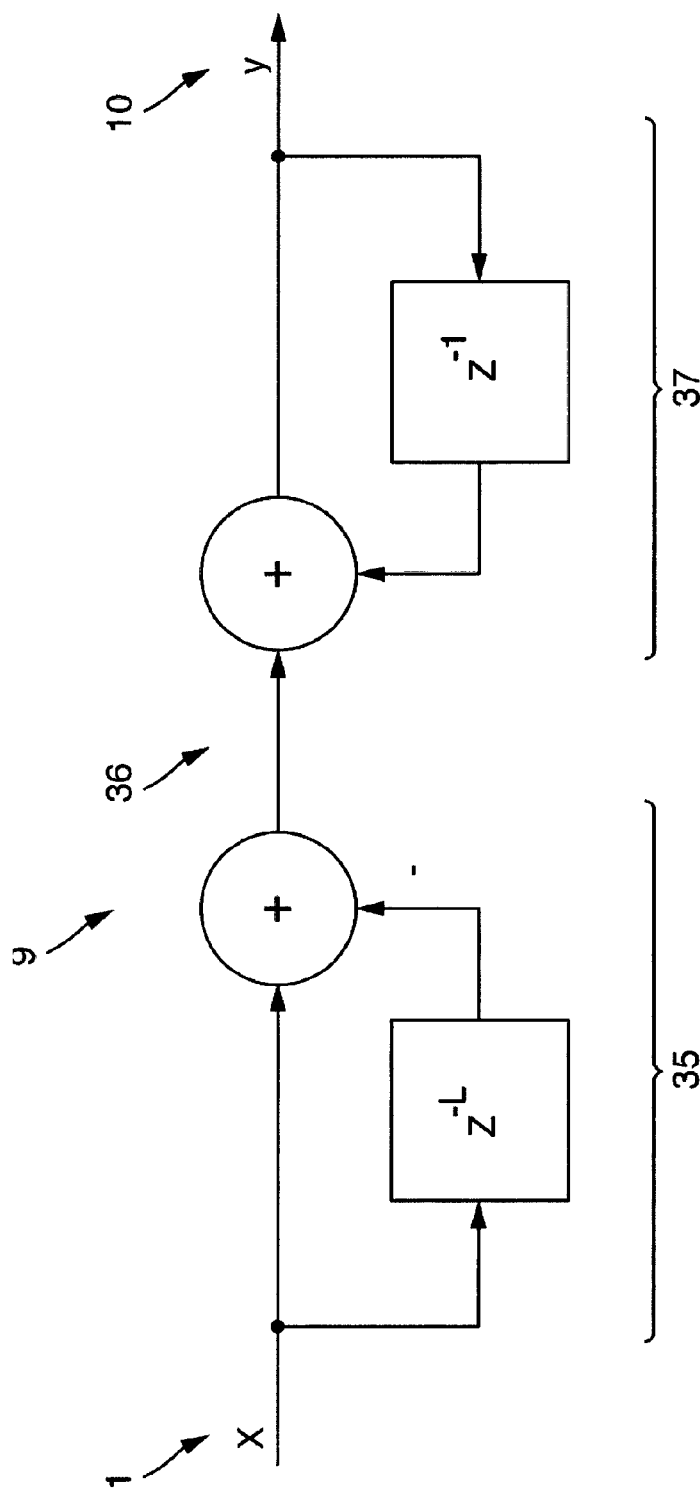
FIG. 3 shows the functioning method of an averaging unit according to the present invention in a schematic diagram.

In FIG. 3, the functioning method of averaging units 9, 17, 28 of decoding device 4 is clarified in greater detail by way of example for the case of moving-type data-averaging unit 9.

Manchester-encoded signal 1 is supplied to moving-type data-averaging unit 9.

In a differential stage 35, a derived signal 36 in the form of a differential signal is derived from Manchester-encoded signal 1. To that end, for the individual symbols x of Manchester-encoded signal 1, in each case the difference of symbol x is formed with respect to a symbol—time-shifted by a predefined time duration L relative to this symbol x—in Manchester-encoded signal 1.

Derived signal 36 is subsequently supplied to an integration stage 37, in which derived signal 36 is integrated. Moving-type data-averaging unit 9 thus makes a moving data average 10 available, which is made up of symbols y.

Figure 4:
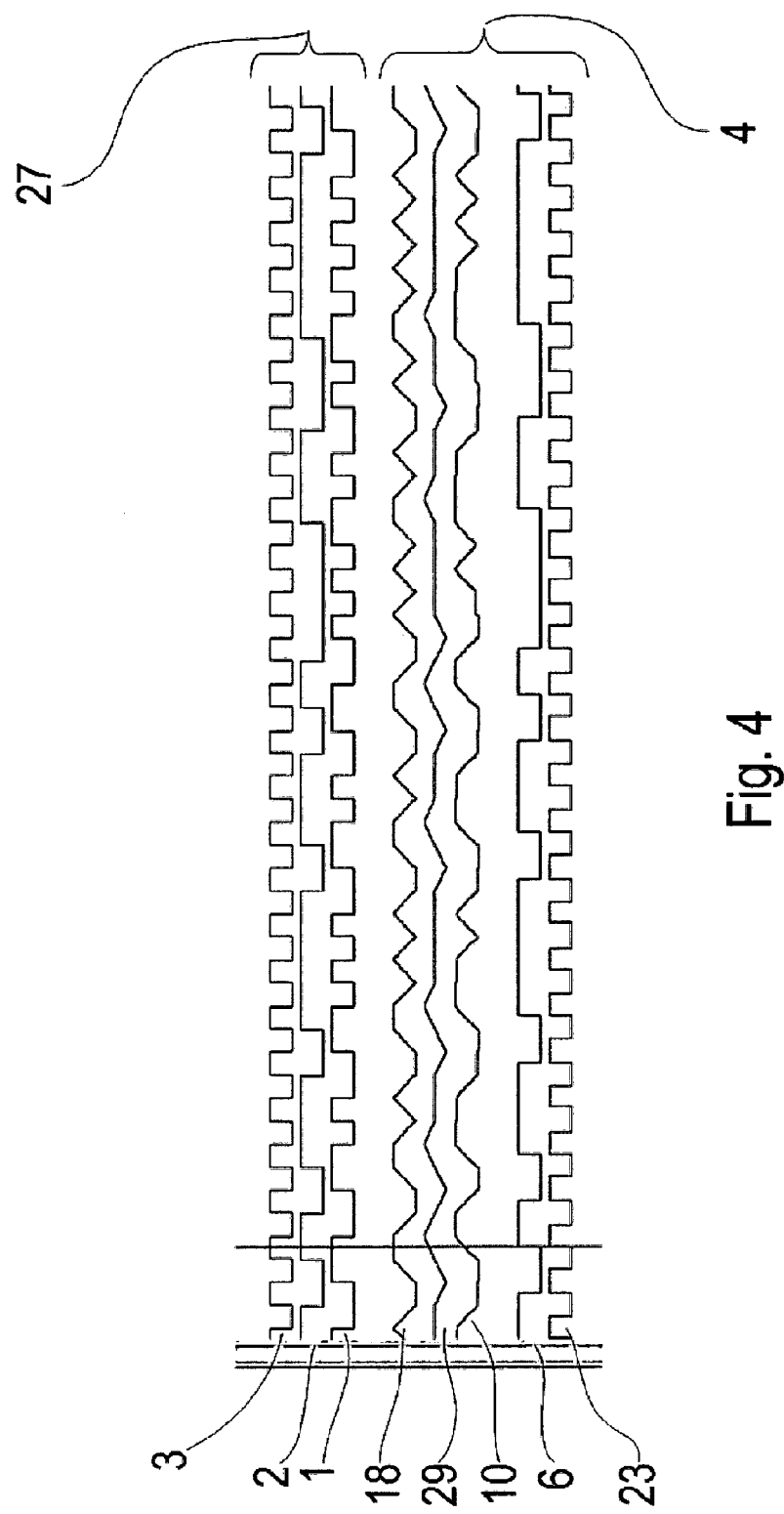
FIG. 4 shows signal patterns by way of example for clarifying the method of the present invention and the functional principle of the decoding device according to the invention.

FIG. 4 shows a signal pattern at encoding device 27 and decoding device 4 by way of example.

In encoding device 27, a Manchester-encoded signal 1 is generated for input original data signal 2 and an original clock signal 3 generated in encoding device 27.

This Manchester-encoded signal 1 is transmitted to decoding device 4.

In decoding device 4—as described—a moving data average 10, a moving clock average 18 and a moving EOT average 29 are formed from Manchester-encoded signal 1.

It is evident that these average values are not binary, but rather very fine-stepped, nearly analog.

Decoded data signal 6 is generated from moving data average 10 using the comparators mentioned. By the described threshold-value comparison in clock comparator 19 and by the likewise described logic operation in logic-operations device 24, with this data signal 6 and moving clock average 18, a clock signal 23 is generated and output. It is apparent that clock signal 23 has the same bit time as original clock signal 3, but that decoded signals 6, 23 are time-shifted relative to original signals 2, 3.

Figure 5:
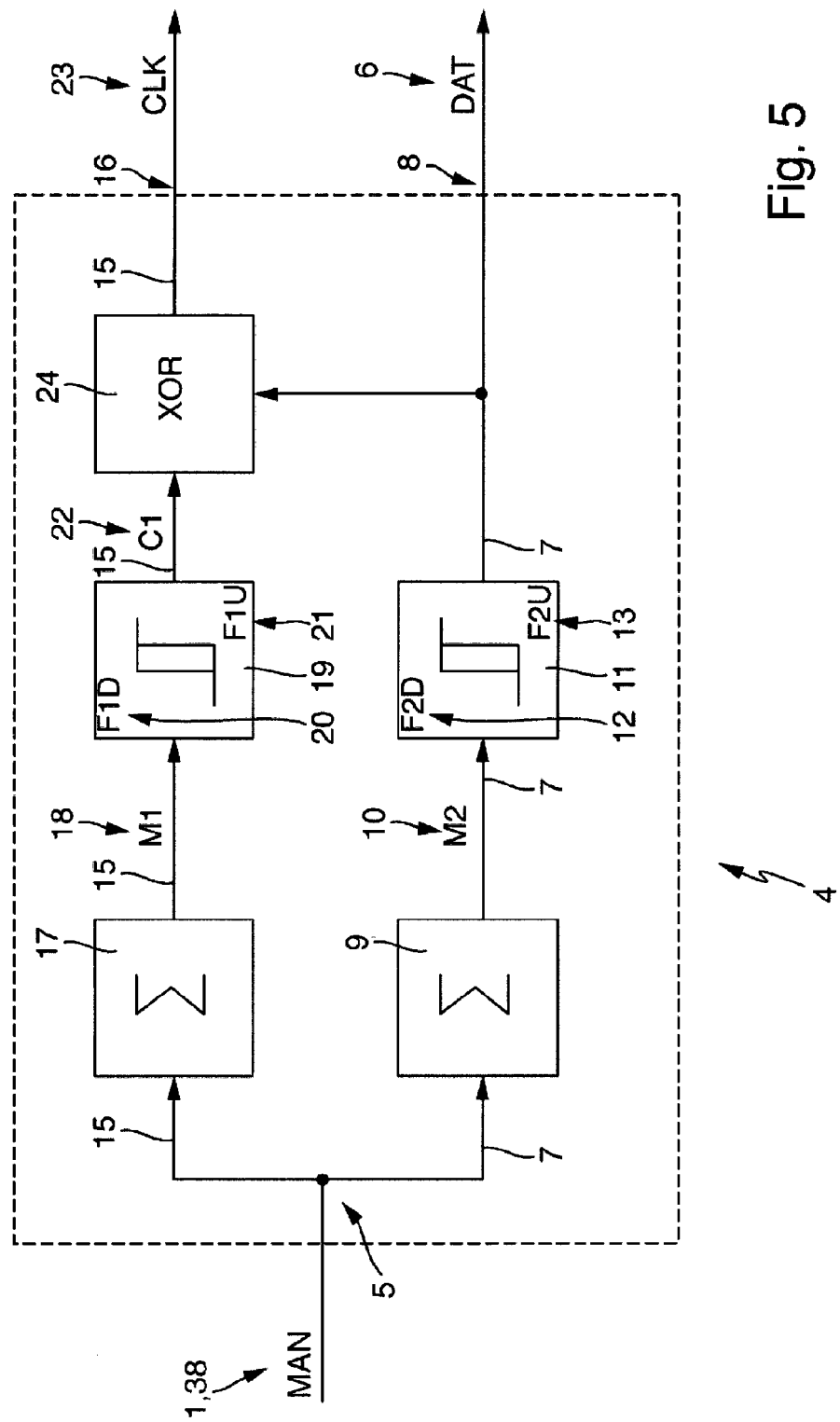
FIG. 5 shows a further decoding device of the present invention for exemplification of a simplified decoding method of the invention.

FIG. 5 shows a further exemplary embodiment of a decoding device 4 according to the present invention.

In the case of decoding device 4 according to FIG. 5, components which are the same as or similar to the decoding device according to FIG. 2 in terms of function and/or structure are denoted with the same reference numerals and are not described separately again. The explanations there hold true correspondingly for decoding device 4 according to FIG. 5.

In contrast to the exemplary embodiment according to FIG. 2, no EOT-signal flow path is formed in decoding device 4 according to FIG. 5.

Rather, decoding device 4 has only a data-signal flow path 7 and a clock-signal flow path 15, which operate in the manner described in connection with FIG. 2 and FIG. 3.

Figure 6:
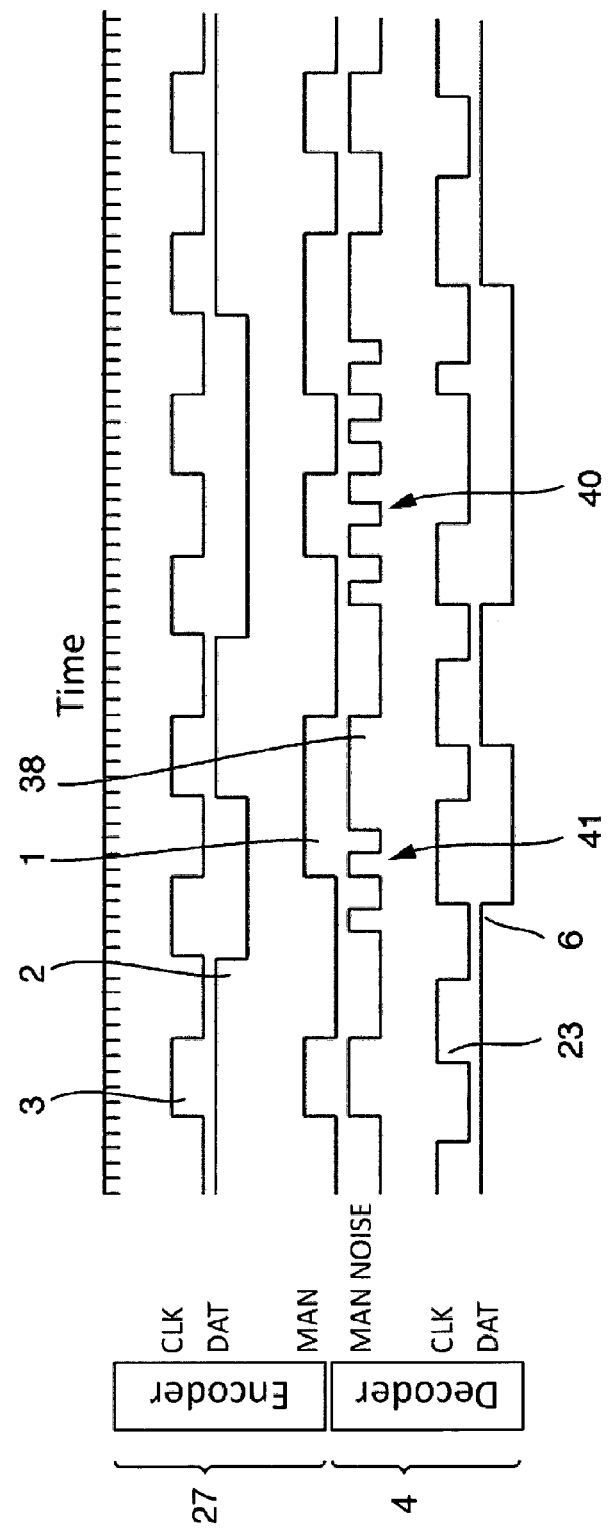
FIG. 6 shows signal patterns by way of example for clarifying the method of the present invention and the functional principle of the decoding device of the invention according to FIG. 5, the received Manchester-encoded signal having an interference.

FIG. 6 shows a typical signal pattern by way of example for decoding device 4 according to FIG. 5.

As already explained in connection with FIG. 4, a Manchester-encoded signal 1 is generated in encoding device 27 from an original data signal 2 and an original clock signal 3.

This Manchester-encoded signal 1 is transmitted to decoding device 4.

To illustrate the robustness of the method according to the present invention, let us assume that during transmission, Manchester-encoded signal 1 is disturbed by noise with higher-frequency interferences 40, 41.

Therefore, a noisy Manchester-encoded signal 38 is received at decoding device 4.

From noisy Manchester-encoded signal 38, decoding device 4 forms a decoded data signal 6 and a decoded clock signal 23 in a manner analogous to the explanations for FIGS. 1 through 4.

It is obvious that interferences 40 and 41 bring about a temporarily erroneous bit time of clock signal 23 which, however, returns very quickly again to the actual bit time of original clock signal 3.

It is also clear that clock signal 23 switches over synchronously with data signal 6, so that even in the case of temporarily slightly erroneous bit times of clock signal 23, data signal 6 is able to be interpreted correctly.

Figure 7:
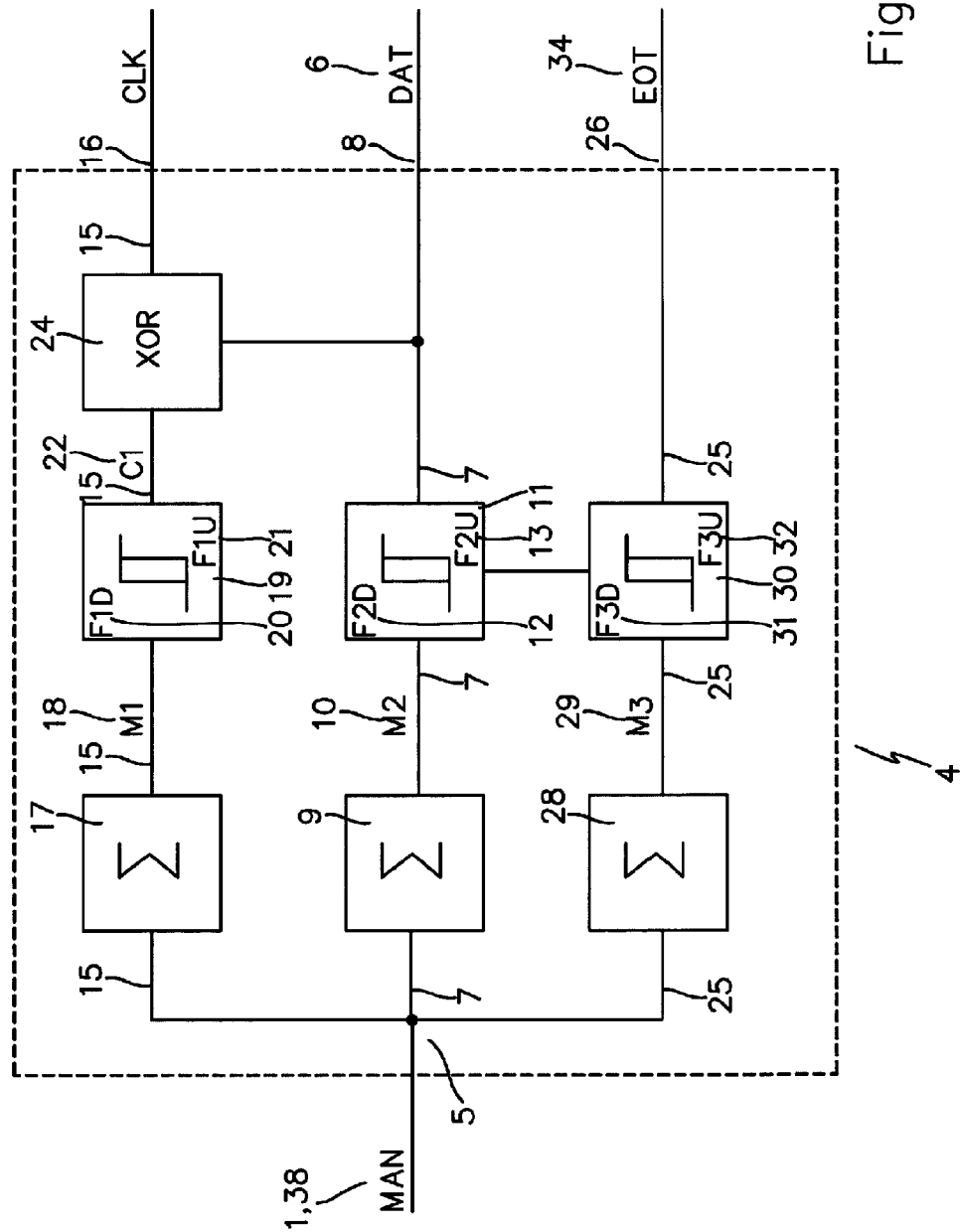
FIG. 7 shows a further decoding device of the present invention for exemplification of a simplified decoding method of the invention, in which an EOT signal is usable to reset the decoding device according to the invention.

FIG. 7 shows a further exemplary embodiment of a decoding device 4 according to the present invention.

In the case of decoding device 4 according to FIG. 7, components which are the same as or similar to the decoding device according to FIGS. 2 and/or 5 in terms of function and/or structure are denoted with the same reference numerals and are not described again separately. The explanations there hold true correspondingly for decoding device 4 according to FIG. 7.

In the case of decoding device 4, in addition to the exemplary embodiment according to FIG. 2, a control connection 42 is formed between EOT comparator 30 and data comparator 11. Decoding device 4 is set up in such a way that data threshold values 12, 13 in data comparator 11 are able to be reset or become reset to standard values when an end of transmission is or becomes detected in EOT comparator 30. Therefore, the sensitivity of data comparator 11 is able to be reset and becomes reset after the complete data transmission, in order to prepare decoding device 4 for the new data reception.

In further exemplary embodiments, a control connection is formed alternatively or additionally between EOT comparator 30 and moving-type data-averaging unit 9. Thus, in the case of these exemplary embodiments, upon a new data transmission, the averaging may be carried out from a defined starting value. Thus, for example, the decoding of the input signal of signal input 5 is able to be blocked and is blocked so long as EOT comparator 30 has not yet recognized a signal transmission. Logical sequences for marking the signal start are dispensable.

It should also be mentioned with regard to FIG. 3 that the respective average times of moving-type data-averaging unit 9, of moving-type clock-averaging unit 17 and of moving-type EOT-averaging unit 28 define time duration L in differential stage 35.

From FIGS. 4 and 6, it is evident that moving average values 10, 18, 29 are formed in ongoing manner simultaneously and concurrently relative to each other, while further symbols x of Manchester-encoded signal 1 are made available isochronously at signal input 5. Data signal 6 and clock signal 23 and optionally EOT signal 34 are therefore formed in real time synchronously with the clock pulse of Manchester-encoded signal 1.

The working cycle of decoding device 4 is predefined by a sampling rate with which average values 10, 18, 29 mentioned are generated in averaging units 9, 17, 28. In the exemplary embodiment presented, a sampling rate is used which includes 256 samplings per bit time of clock signal 3. Different sampling rates are realized in further exemplary embodiments.

It should also be mentioned that the methods described here are also transferable to input signals transmitted in inverted fashion. In such a case, the a priori known starting sequence of Manchester-encoded signal 1 must be adapted. In the same way, the use may be transferred to transmission with an idle state 1.

In the case of decoding device 4 for a Manchester-encoded signal 1, it is proposed, using moving-type averaging units 9, 17, 28, to form at least one moving data average 10 and/or one moving clock average 18 relative to average times differing from each other, and from these moving averages 10, 18, 29, to make binary output signals available as data signal 6 and/or clock signal 23 with the aid of comparators 11, 19, 30.

LIST OF REFERENCE SYMBOLS

1 Manchester-encoded signal
2 original data signal
3 original clock signal
4 decoding device
5 signal input
6 data signal
7 data-signal flow path
8 data-signal output
9 moving-type data-averaging unit
10 moving data average
11 data comparator
12 lower data threshold value
13 upper data threshold value
14 output signal
15 clock-signal flow path
16 clock-signal output
17 moving-type clock-averaging unit
18 moving clock average
19 clock comparator
20 lower clock threshold value
21 upper clock threshold value
22 output signal
23 clock signal
24 logic-operations device
25 EOT-signal flow path
26 EOT-signal output
27 encoding device
28 moving-type EOT-averaging unit
29 moving EOT average
30 EOT comparator
31 lower EOT threshold value
32 upper EOT threshold value
33 output signal
34 EOT signal
35 differential stage
36 derived signal
37 integration stage
38 noisy Manchester-encoded signal
39 signal output
40 interference
41 interference
42 control connection
x symbol
y symbol
L time duration

What is claimed is:

1. A decoding method for a Manchester-encoded signal, comprising:

forming a moving data average with a data average time for the Manchester-encoded signal;
forming a decoded data signal from the moving data average by a data comparator, wherein the decoded data signal is made available;
forming a moving clock average with a clock average time for the Manchester-encoded signal;
forming a clock signal at least from the moving clock average by a clock comparator, wherein the clock signal is available;
forming a moving EOT average with an EOT average time for the Manchester-encoded signal, wherein the EOT average time is longer than at least one of the data average time and the clock average time; and
forming an EOT signal from the moving EOT average by an EOT comparator, wherein the EOT signal is made available.

2. The decoding method as recited in claim 1, wherein at least one of:
the forming of the clock signal includes logically combining an output signal of the clock comparator with an output signal of the data comparator,
the clock average time is shorter than the data average time, and
the forming of at least one of the moving data average, the clock average, and the EOT average includes integrating a signal derived from the Manchester-encoded signal over at least one of the data average time, the clock average time, and the EOT average time.

3. The decoding method as recited in claim 2, wherein the logically combining includes logically combining by an exclusive OR operation.

4. The decoding method as recited in claim 2, wherein the output signal of the data comparator includes the decoded data signal.

5. The decoding method as recited in claim 2, wherein the forming of at least one of the moving data average, the clock average, and the EOT average includes progressively forming a differential signal from differences between each symbol (x) of the Manchester-encoded signal and a symbol, which is time-shifted relative to the symbol (x) by a predefined time duration, of the Manchester-encoded signal as the signal derived from the Manchester-encoded signal.

6. The decoding method as recited in claim 1, wherein at least one of:
the data comparator compares the moving data average to at least one data threshold value and outputs the decoded data signal as a function of one of an exceedance of and drop below the at least one data threshold value, and
the at least one data threshold value includes a lower data threshold value and an upper data threshold value, and the data comparator outputs the decoded data signal as a function of one of an exceedance of the upper data threshold value and a drop below the lower data threshold value.

7. The decoding method as recited in claim 6, wherein at least one of:
an arithmetic mean of the lower data threshold value and the upper data threshold value lies between zero and one,
a first time duration which is at least one of greater than a half-bit time and less than 1.5 times the bit time of the clock signal of the Manchester-encoded signal is established as the data average time,
a second time duration which is less than the bit time of the clock signal of the Manchester-encoded signal is established as a the clock average time,
a third time duration which is greater than the bit time of the clock signal of the Manchester-encoded signal is established as the EOT average time, and
the clock comparator compares the moving clock average to at least one clock threshold value and outputs an output signal as a function of one of an exceedance of and drop below the at least one clock threshold value.

8. The decoding method as recited in claim 7, wherein the arithmetic mean is ½.

9. The decoding method as recited in claim 7, wherein the first time duration equals the bit time.

10. The decoding method as recited in claim 7, wherein the second time duration equals the half-bit time.

11. The decoding method as recited in claim 7, wherein the third time duration equals 1.5 times the bit time.

12. The decoding method as recited in claim 7, wherein at least one of:
the at least one clock threshold value includes a lower clock threshold value and an upper clock threshold value,
the clock comparator outputting the output signal as a function of one of an exceedance of the upper clock threshold value and a drop below the lower clock threshold value,
an arithmetic mean of the lower clock threshold value and the upper clock threshold value lies between zero and one,
at least one of the moving data average, clock average, and the EOT average is formed at least one of simultaneously and concurrently relative to each other,
at least one of the moving data average, the clock average, and the EOT average is formed with a sampling rate which in each case is less than a bit time of the clock signal of the Manchester-encoded signal, and
at least one of the moving data average, the clock average, and the EOT average is formed isochronously with a provision of further symbols (x) of the Manchester-encoded signal.

13. The decoding method as recited in claim 12, wherein the arithmetic mean is at least one of below the arithmetic mean of the lower data threshold value and the upper data threshold value, and at ¼.

14. The decoding method as recited in claim 12, wherein at least one of the moving data average, the clock average, and the EOT average is formed with a sampling rate which in each case is less than one tenth or one hundredth of the clock signal.

15. A decoding device, comprising:
a signal input for a Manchester-encoded signal;
a data-signal output for a data signal decoded from the Manchester-encoded signal;
a moving-type data-averaging unit; a data comparator;
a data-signal flow path arranged from the signal input to the moving-type data-averaging unit, from the moving-type data-averaging unit to the data comparator, and from the data comparator to the data-signal output;
a clock-signal output for a clock signal decoded from the Manchester-encoded signal;
a moving-type clock-averaging unit;
a clock comparator;
a clock-signal flow path set up from the signal input to the moving-type clock-averaging unit, from the moving-type clock-averaging unit to the clock comparator, and from the clock comparator to the clock-signal output;
an EOT-signal output for an EOT signal derived from the Manchester-encoded signal;
a moving-type EOT-averaging unit;
an EOT comparator; and an EOT-signal flow path set up from the signal input to the moving-type EOT-averaging unit, from the moving-type EOT-averaging to the EOT comparator, and from the EOT comparator to the EOT-signal output.

16. The decoding device as recited in claim 15, wherein at least one of: a moving average of a signal derived from the Manchester-encoded signal is able to be formed by the moving-type data-averaging unit over a data average time, the moving average of the signal derived from the Manchester-encoded signal is able to be formed by the moving-type clock-averaging unit over a clock average time, and the moving average of the signal derived from the Manchester-encoded signal is able to be formed by the moving-type EOT-averaging unit over an EOT average time.

17. A decoding device, comprising:
a signal input for a Manchester-encoded signal;
a data-signal output for a data signal decoded from the Manchester-encoded signal;
a moving-type data-averaging unit; a data comparator;
a data-signal flow path arranged from the signal input to the moving-type data-averaging unit, from the moving-type data-averaging unit to the data comparator, and from the data comparator to the data-signal output;
a clock-signal output for a clock signal decoded from the Manchester-encoded signal;
a moving-type clock-averaging unit;
a clock comparator; and
a clock-signal flow path set up from the signal input to the moving-type clock-averaging unit, from the moving-type clock-averaging unit to the clock comparator, and from the clock comparator to the clock-signal output, wherein at least one of:
a logic-operations device is set up for a logical interconnection of an output signal of the data comparator with an output signal of the clock comparator, and
the clock-signal flow path is routed from a signal output of the logic-operations device to the clock-signal output.

18. The decoding device as recited in claim 15, wherein at least one of: the data comparator outputs an output signal as a function of at least one of one of an exceedance of and drop below at least one data threshold value, the clock comparator outputs an output signal as a function of one of an exceedance of and drop below at least one clock threshold value, the EOT comparator outputs an output signal as a function of one of an exceedance of and drop below at least one EOT threshold value.

19. The decoding device as recited in claim 18, wherein the data comparator outputs the output signal as a function of one of an exceedance of an upper data threshold value of the at least one data threshold value and a drop below a lower data threshold value of the at least one data threshold value.

20. The decoding device as recited in claim 18, wherein the clock comparator outputs the output signal as a function of one of an exceedance of an upper clock threshold value of the at least one clock threshold value and a drop below a lower clock threshold value of the at least one clock threshold value.

21. The decoding device as recited in claim 18, wherein the EOT comparator outputs the output signal as a function of at least one of an exceedance of an upper EOT threshold value of the at least one EOT threshold value and a drop below a lower EOT threshold value of the at least one EOT threshold value.

22. A decoding device, comprising:
a signal input for a Manchester-encoded signal;
a data-signal output for a data signal decoded from the Manchester-encoded signal;
a moving-type data-averaging unit; a data comparator; and
a data-signal flow path arranged from the signal input to the moving-type data-averaging unit, from the moving-type data-averaging unit to the data comparator, and from the data comparator to the data-signal output, wherein at least one of:
the device is set up for at least one of a simultaneous formation and a concurrent formation of at least one of a moving data average, a clock average, and EOT average,
at least one of the moving data average, the clock average, and the EOT average is able to be formed with a sampling rate that in each case is less than the bit time, and
the device is set up to form at least one of the moving data average, the clock average, and the EOT average isochronously with the provision of further symbols of the Manchester-encoded signal.

23. The decoding device as recited in claim 22, wherein the sampling rate is less than one of one tenth and one hundredth of the clock signal of the Manchester-encoded signal.

* * * * *